US007180438B2

(12) United States Patent
Lin

(10) Patent No.: US 7,180,438 B2
(45) Date of Patent: Feb. 20, 2007

(54) SOURCE DRIVING DEVICE AND TIMING CONTROL METHOD THEREOF

(75) Inventor: Che-Li Lin, Taipei (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 11/252,418

(22) Filed: Oct. 17, 2005

(65) Prior Publication Data

US 2006/0255994 A1 Nov. 16, 2006

(30) Foreign Application Priority Data

May 10, 2005 (TW) ............................... 94115009 A

(51) Int. Cl.
*H03M 1/66* (2006.01)

(52) U.S. Cl. ....................................... 341/144; 345/204

(58) Field of Classification Search ................ 341/155, 341/144; 345/76, 204
See application file for complete search history.

(56) References Cited

U.S. PATENT DOCUMENTS 6,977,635 B2 * 12/2005 Ogawa et al. ................ 345/93
2005/0140595 A1 * 6/2005 Yang et al. ................... 345/76
2006/0066602 A1 * 3/2006 Date .......................... 345/204

* cited by examiner

*Primary Examiner*—Peguy JeanPierre
(74) *Attorney, Agent, or Firm*—J.C. Patents

(57) ABSTRACT

A source driver includes a data-receiving device, a data switch device, a voltage generator, a voltage switch set, a digital to analog (DAC) set, an output unit set, and a timing control device. The data-receiving device receives, registers and outputs a data signal, and the data switch set selectively outputs the data signal from the data-receiving device in response to a first timing signal. The voltage generator generates a plurality of voltages according to the reference voltages. The voltage switch set selectively outputs the voltages from the voltage generator in response to a second timing signal. The DAC set receives and outputs the selectively outputted voltages according to the selectively outputted data signal. The output unit set receives the selectively outputted voltages from the DAC and outputs an output voltage in response to a third timing signal. The timing control device provides the first, second and third timing signals.

17 Claims, 10 Drawing Sheets

SOURCE DRIVING DEVICE AND TIMING CONTROL METHOD THEREOF

CROSS-REFERENCE TO RELATED APPLICATION

This application claims the priority benefit of Taiwan application serial no. 94115009, filed on May 10, 2005. All disclosure of the Taiwan application is incorporated herein by reference.

BACKGROUND OF THE INVENTION

1. Field of Invention

The present invention relates to a source driver of a display panel. More particularly, the present invention relates to a source driver of a display panel which has reduced circuit wiring, and timing control method thereof.

2. Description of Related Art

Recently, the flat panel displays including thin film transistor liquid crystal displays (TFT-LCD), low temperature ploy-silicon (LPTS) liquid crystal displays, and organic light-emitting displays (OLED) have continued to progress. Wherein the displaying portion of a flat panel display is composed of pixel arrays. Generally, the pixel array is a determinant matrix which is controlled by a driver to drive the corresponding pixels according to dots of image data and displays the designated color at the designated time. FIG. 1 is a block diagram illustrating a conventional source driver. Referring to FIG. 1, the source driver 100 includes a shift register 102, a line latch 104, a level shifter 106, a digital to analog converter (DAC) 108, an output buffer 110, and a gray scale voltage generator 112. Signals including start signal, shift signal, clock signal, polarity signal, and control signal are used in driving operation of source driver 100. Wherein, after a data signal input 101 is transmitted into line latch 104, the data signal will be sequentially transferred through the components in said source driver according to start signal, shift signal, clock signal, as shown in FIG. 1. The DAC 108 receives the polarity signal and simultaneously the control signal is received by the DAC 108 and the line latch 104, the gray scale voltage generator 112 outputs the desired voltages. Finally, the analog voltages are outputted as driving voltages to the transistors of the display pixels through the output channels (Y1~Y384 in FIG. 1) respectively after passing through output buffer 110.

To provide a display panel having high resolution display performance, a Gamma voltage generator within the source driver must be able to provide more different voltages for data transmitting condition of more bits. Therefore, the circuit wiring needed within a Gamma voltage generator is of a large number and takes up a lot of space within the source driver. FIGS. 2A and 2B illustrate a representative diagram and the block diagram of the circuit of a conventional Gamma voltage generator, respectively. Referring to FIGS. 2A and 2B, a conventional Gamma voltage generator generates voltages by inputting a plurality of reference voltages Vgamma x (Vgamma 1~Vgamma m as shown in FIG. 2) from the outside of the source driver, and then obtaining a plurality of desired gray-scale voltages, as the N number of gray-scale voltages ($0^{th}$ Gray Scale~$N^{th}$ Gray Scale shown in FIG. 2) which are provided for the source driver, by performing voltage-dividing using a R-Ladder circuit composed of a plurality of resistors connected in series. FIG. 2B illustrates the circuit block diagram of the Gamma voltage generator in FIG. 2A. As described above, the Gamma voltage generator 200 receives external reference voltages Vgamma to generate desired N number of gray-scale voltages, and wires of those gray scale voltages are electrically connected to DACs. Therefore, the number of different voltages required depends on the gray-scale voltages needed for the displaying resolution of a specific display panel. To be brief, multiple Gamma voltages are obtained by utilizing multiple reference voltages and accompanying R-ladder circuit. However, as the requirement for more different Gamma voltages increases, the space taken by circuit wiring would continue to expand.

Accordingly, to overcome the disadvantage that circuit wiring occupies too much space in the conventional source driver, the present invention provides a source driver which uses the combination of a voltage generator and voltage switch set, capable of effectively reducing the number of wires. In addition, the present invention also provides a timing control method which is used for driving data signals of the source driver.

SUMMARY OF THE INVENTION

Accordingly, the present invention is directed to a source driver, adapted for a display panel and capable of effectively reducing circuit wiring of a voltage generator so as to overcome the problem that the circuit wiring occupies too much space in conventional source driving circuit.

In addition, the present invention relates to a timing control method to drive the data signals of a source driver.

According to an embodiment of the present invention, a source driver of a display panel is provided, wherein the source driver includes a data-receiving device, a data switch set, a voltage generator, a voltage switch set, a digital to analog converter (DAC) set, an output unit set, and a timing control device. The data-receiving device is used for receiving, registering and outputting a data signal. The data switch set is connected to the data-receiving device and is used for selectively outputting the data signal from the data-receiving device in response to a first timing signal. The voltage generator can generate a plurality of voltages according to a plurality of reference voltages. The voltage switch set is connected to the voltage generator and is used for selectively outputting the voltages from the voltage generator in response to a second timing signal. The DAC set, connected to the data switch set and the voltage switch set, is used for receiving and outputting the selectively outputted voltages according to the selectively outputted data signal. The output unit set is connected to the DAC set and is used for receiving the selectively outputted voltages from the DAC and providing an output voltage in response to a third timing signal. The timing control device is used for providing the first, second and third timing signals mentioned above.

According to an embodiment of the present invention, a buffer set which is optionally used is connected between the DAC set and the output unit set to reduce the attenuating of the signals.

According to embodiments of the present invention, the output unit set mentioned above includes L number of data output switches, wherein each of the data output switches is connected to a corresponding DAC to receive and selectively output the analog signal from the DAC.

According to an embodiment of the present invention, the output unit set mentioned above includes 3L number of sample and hold circuits, and every three sample and hold circuits are connected to a corresponding DAC, and these 3L number of sample and hold circuits are used to sample and hold the data signal inputted from the DAC set.

According to an embodiment of the present invention, the data signal is latched and outputted synchronously by the sample and hold circuits.

According to an embodiment of the present invention, the data switch may be a NMOS, a PMOS, or a transmission gate.

According to an embodiment of the present invention, the voltage switch may be a NMOS, a PMOS, or a transmission gate.

According to an embodiment of the present invention, the sample and hold circuit may be a NMOS, a PMOS, or a transmission gate.

The present invention provides a timing control method including the following steps: (a) Receiving a data signal by a data-receiving device, wherein the data signal includes a plurality of color data signals, and selectively outputting one of the color data signals in response to a first timing signal; (b) Generating a plurality of voltages according to a plurality of reference voltages by a voltage generator, and selectively outputting the voltages in response to a second timing signal; and (c) Outputting the selectively outputted voltages according to the data signal which is selectively outputted by a DAC set, and selectively outputting an output voltage in response to a third timing signal. Also, the steps (a), (b), and (c) are repeated until all the color data signals of the data signal have been outputted.

According to an embodiment of the present invention, the color data signals may be of the three primary colors correspondingly.

According to an embodiment of the present invention, the above-mentioned color data signals may be of white color and the three primary colors.

Since the present invention uses the combination of a voltage generator and voltage switch set to save the wires connecting to the DAC, the problem of Gamma wiring taking up too much space in conventional source driver can be solved. Further, the present invention proposes a timing control method utilizing switches or sample and hold circuits which can provide various ways of driving timings of data output.

In order to the make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
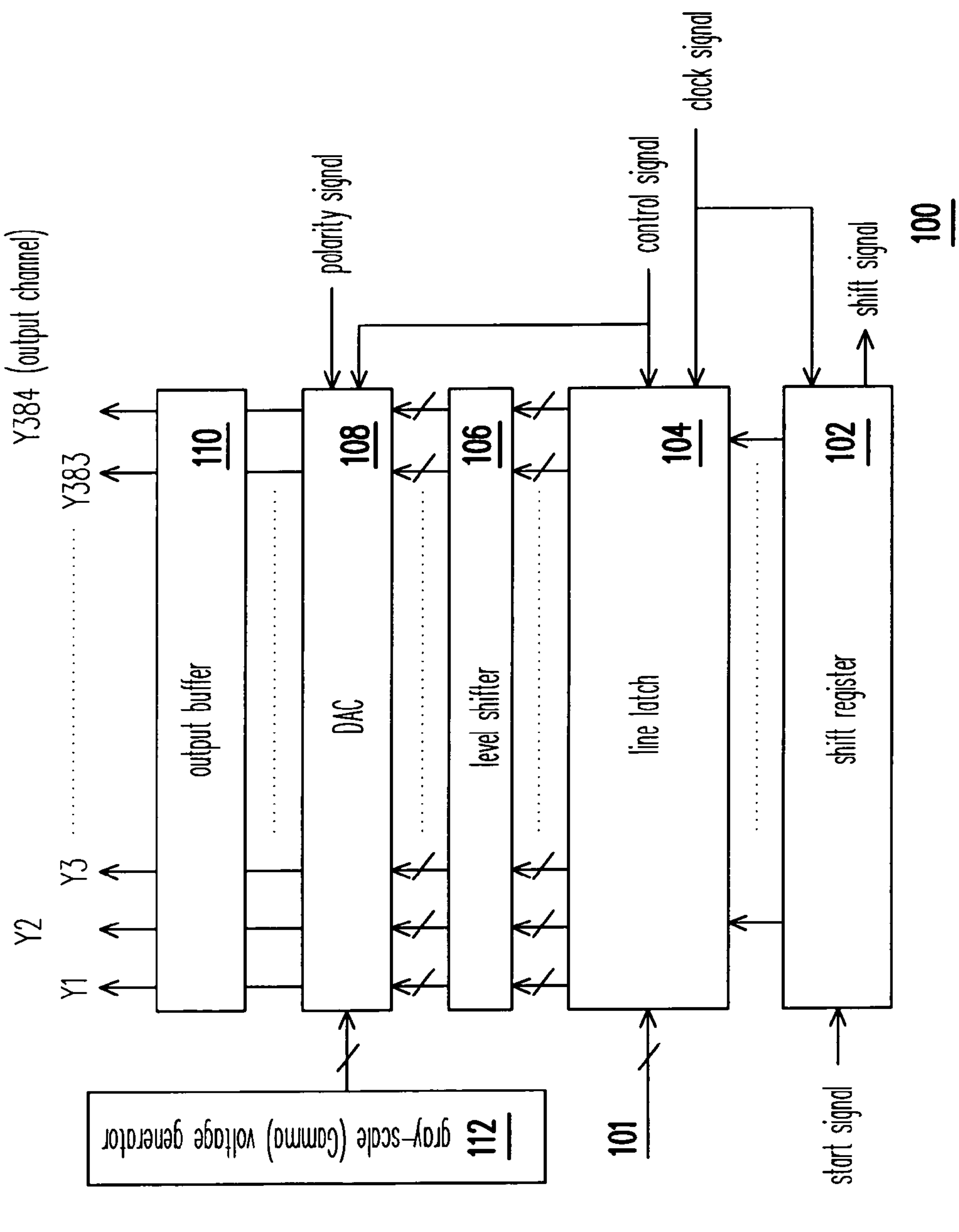
FIG. 1 (PRIOR ART)
FIG. 1 is a block diagram of a conventional source driver.
Figure 2B:
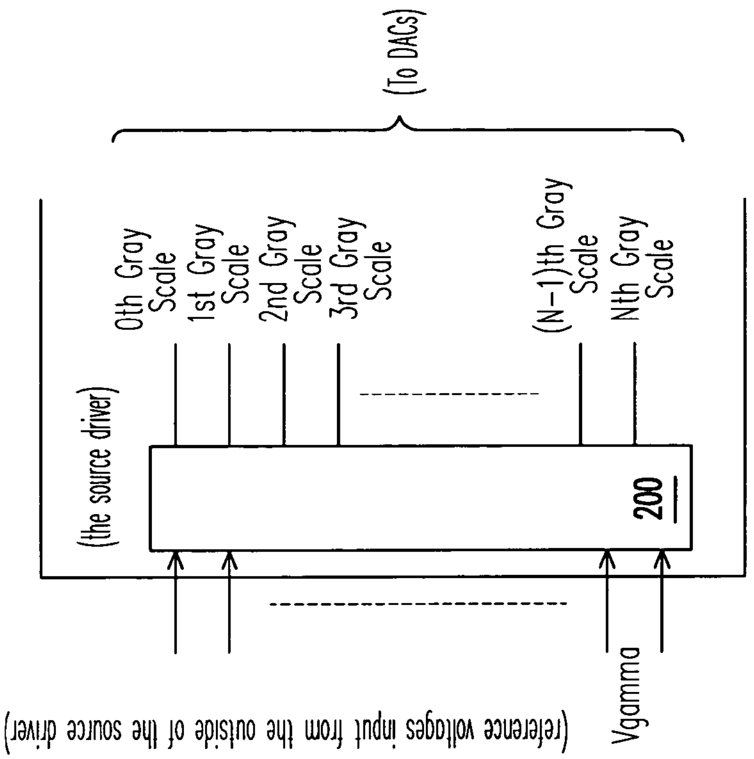
FIG. 2B(PRIOR ART)
FIG. 2B is a circuit block diagram illustrating the circuit of a conventional Gamma voltage generator.
Figure 2A:
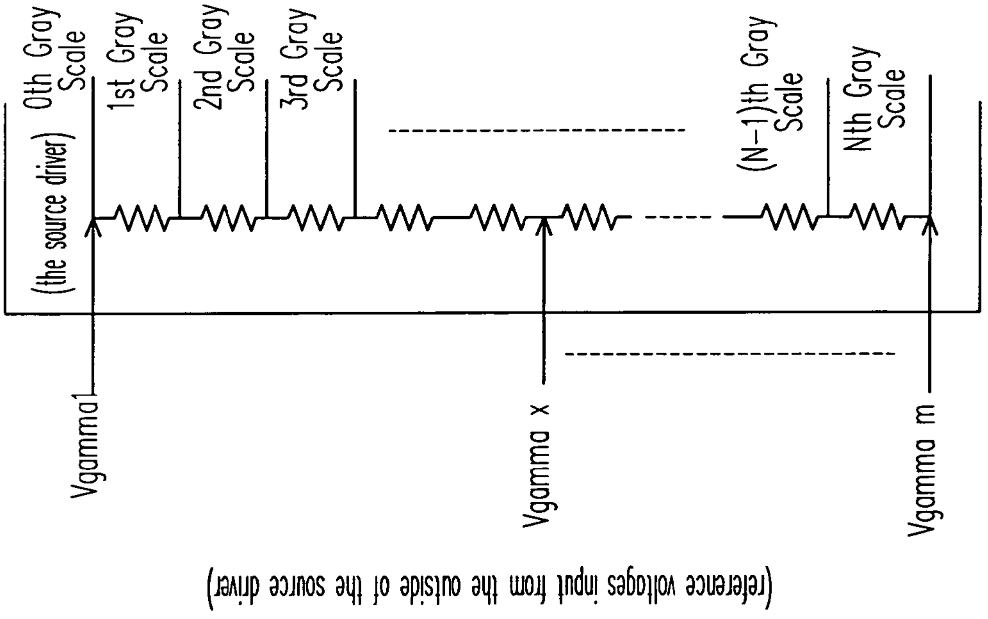
FIG. 2A(PRIOR ART)
FIG. 2A is a representative diagram illustrating the circuit of a conventional Gamma voltage generator.
Figure 3B:
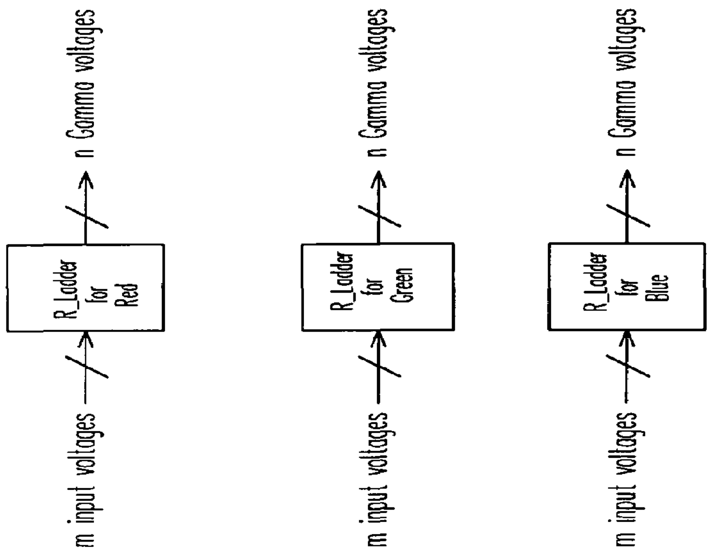
FIGS. 3A and 3B are a circuit block and a simplified circuit diagram respectively illustrating a Gamma voltage generator according to an embodiment of the present invention.
Figure 3A:
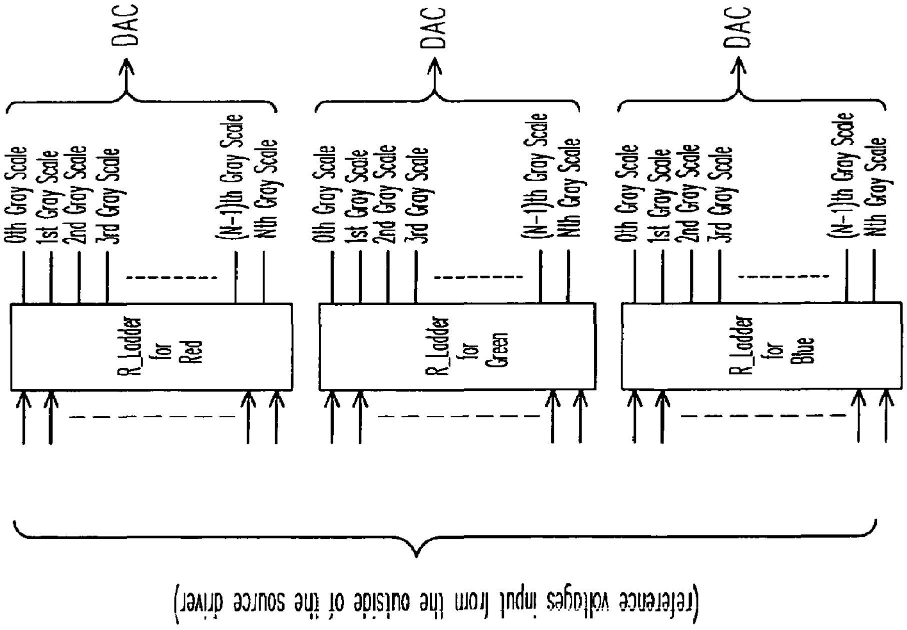

FIGS. 3A and 3B are a circuit block and a simplified circuit diagram respectively illustrating a Gamma voltage generator according to an embodiment of the present invention. Referring to FIGS. 3A and 3B, note that the principle of the Gamma voltage generator herein is identical to that illustrated in FIGS. 2A and 2B, except in FIGS. 3A and 3B three sets of Gamma voltage generators respectively used for red, green, and blue are illustrated. The known Gamma voltage generator in FIG. 3A is of Resistor Ladder (R-ladder) type and is composed of multiple resistors connected in series. After receiving the input of m number of reference voltages from the outside, Gamma voltage generator outputs n number of Gamma voltages to a DAC via the R-ladder circuit. The three Gamma voltage generators as described in FIG. 3A provide the gray-scale voltages for three primary colors (R, G, B) respectively. For the convenience of description, the simplified block diagram of R-Ladder circuit is shown in FIG. 3B. In FIG. 3B, three voltage generators are also R-Ladder circuits for providing R, G, B voltages respectively. Similarly, each of the R-Ladder circuits for various colors receives m input reference voltages and outputs n Gamma voltages to be used by the source driver, respectively.

Figure 4:
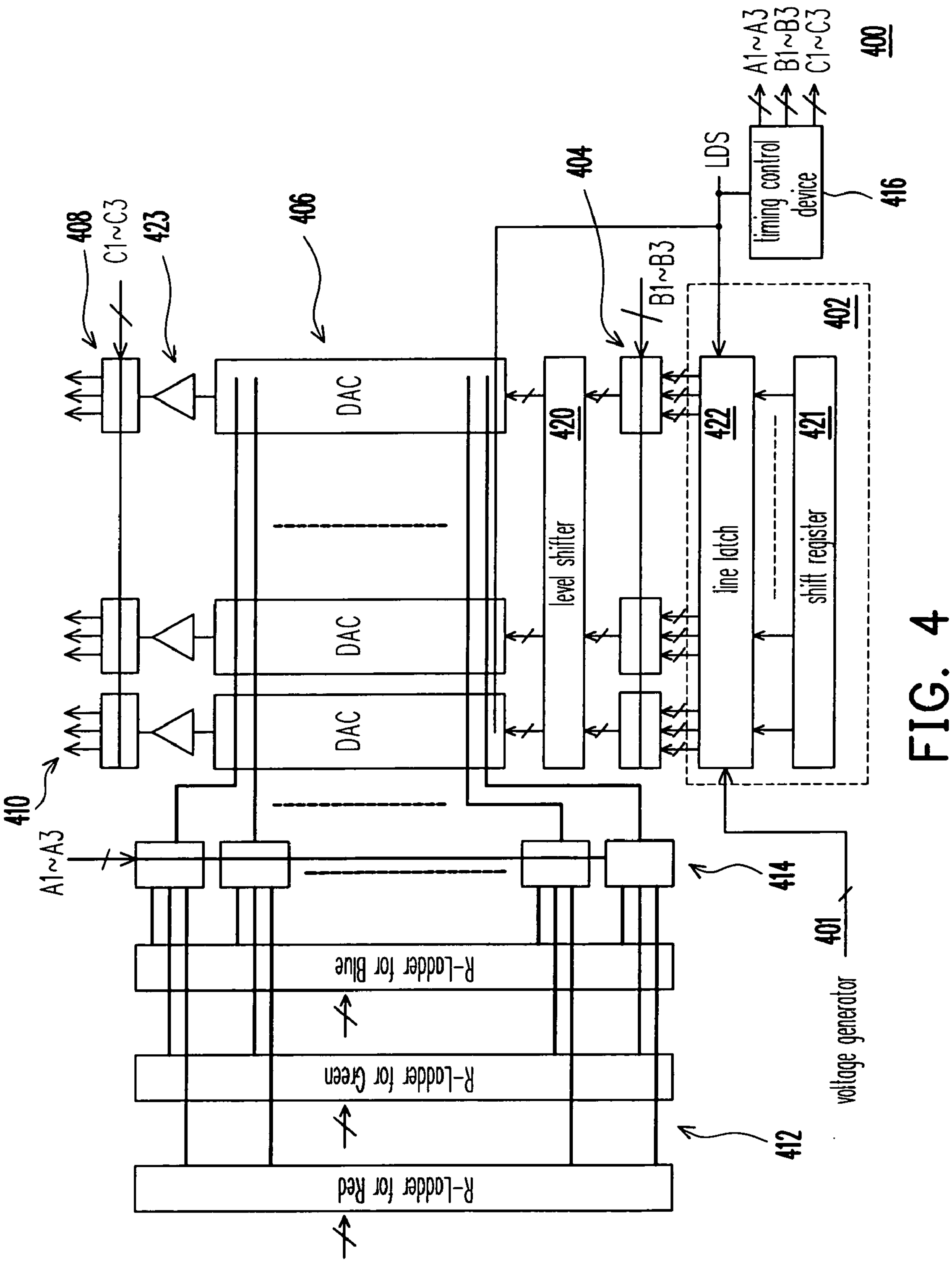
FIG. 4 is a circuit block illustrating a source driver according to an embodiment of the present invention.

FIG. 4 is a circuit block diagram illustrating a source driver adapted to a display panel according to an embodiment of the present invention. Referring to FIG. 4, source driver 400 includes: a data-receiving device 402, which receives data signal input 401 and then registers and outputs the received data signal input 401; a data switch set 404 including L number of data switches and connected to the data-receiving device 402 for selectively outputting the data signal from the data-receiving device 402; a voltage generator 412 which generates n number of voltages basing on m number of reference voltages inputted externally, to be used by the source driver 400; a digital to analog converter set (DAC) 406 including L number of digital to analog converters, wherein each DAC receives the data signal from the data-receiving device 402 and converts this digital data signal into an analog data signal; a voltage switch set 414 including N number of voltage switches, wherein each of the voltage switches is used for selectively outputting one of the voltages from the voltage generator 412, and each of the voltage switches is connected to the L number of DACs simultaneously; an output unit set 408 including L number of output units, each of the output unit set being connected to a corresponding DAC to receive and selectively output the analog signal from the DAC; 3L number of output channels 410, every 3 output channels being connected to a corresponding output unit to receive data signal from the output unit and output the data signal to the outside of source driver 400; and a timing control device 416 for generating timing control signals for driving the data-receiving device 402, the DAC set 406, the data switch set 404, the voltage switch set 414, and the output unit set 408.

According to an embodiment of the present invention, the data-receiving device 402 may include a shift register 421 and a line latch 422. Wherein the shift register 421 is used for inputting in parallel or in serial and registering a data signal according to a shift signal which shifts the data signal leftwards or rightwards. The data signal will then be read in parallel or in serial and latched by the line latch 422, which is connected to the shift register 421.

According to an embodiment of the present invention, a selectively used level shifter 420, arranged between the data switch set 404 and the DAC set 406, is used for raising the data signal to a voltage level required.

According to an embodiment of the present invention, the output unit set 408 is composed of L number of data output switches, wherein every data output switch is connected to a corresponding DAC, for receiving and selectively outputting the analog signal from the DAC.

According to an embodiment of the present invention, a selectively used buffer set 423 arranged between the DAC set 406 and the output unit set 408 is used for reducing the attenuation of the signal.

According to an embodiment of the present invention, the voltage generator is a Gamma voltage generator adapted to a display panel. The voltage generator 412, for example, includes 3 voltage generating circuits (i.e. R-Ladder), every voltage generating circuit provided for one of the primary colors (R, G, B) respectively. Wherein, each of the 3 voltage generating circuits is connected to N number of voltage switches respectively to generate N number of Gamma voltages. And each of N number of voltage switches is connected to L number of DACs simultaneously. Note that, in a conventional source driver, the circuit of a Gamma voltage generator converts the voltages inputted from the outside into a plurality of Gamma voltages by an R-Ladder. As to the wiring for these Gamma voltages, for every voltage a wire to be connected to all the DACs is required. Therefore, the more Gamma voltages are needed, the more wires are required. In other words, a great number of driving wires will enormously take up the source driver's space, and once it's used for transferring data signals of more bits, the lack of wiring space will become more serious. For example, in the wiring of a 3-Gamma voltage generator and data transmission rate of 6 bits, 64×3=192 number of wires are needed, while 64×3×2=384 number of wires are needed for bipolar driving case (i.e. switching between positive polarity and negative polarity). For larger size of data transmission rate, e.g. 10 bits, the space taken will be more. Therefore, to overcome this disadvantage of a conventional source driving circuit, the present invention provides a source driver which uses the combination of a voltage generator and a voltage switch set, for effectively reducing the number of voltage wires needed.

According to embodiments of the present invention, one end of each of N number of voltage switches is connected to 3 Gamma voltage generators (R, G, and B) simultaneously, and the other end thereof is connected to all DACs simultaneously, so that the wires connecting to DACs can be saved with thsee voltage switches. Each voltage switch only chooses one of R, G, and B and conducts its connection to the DAC. To be brief, the voltage wiring of 3 Gamma voltage generators needs only to be connected to the voltage switch set, and then to the DACs. Accordingly, the wires connected to the DACs are reduced to one third compared with the conventional wiring.

Figure 5:
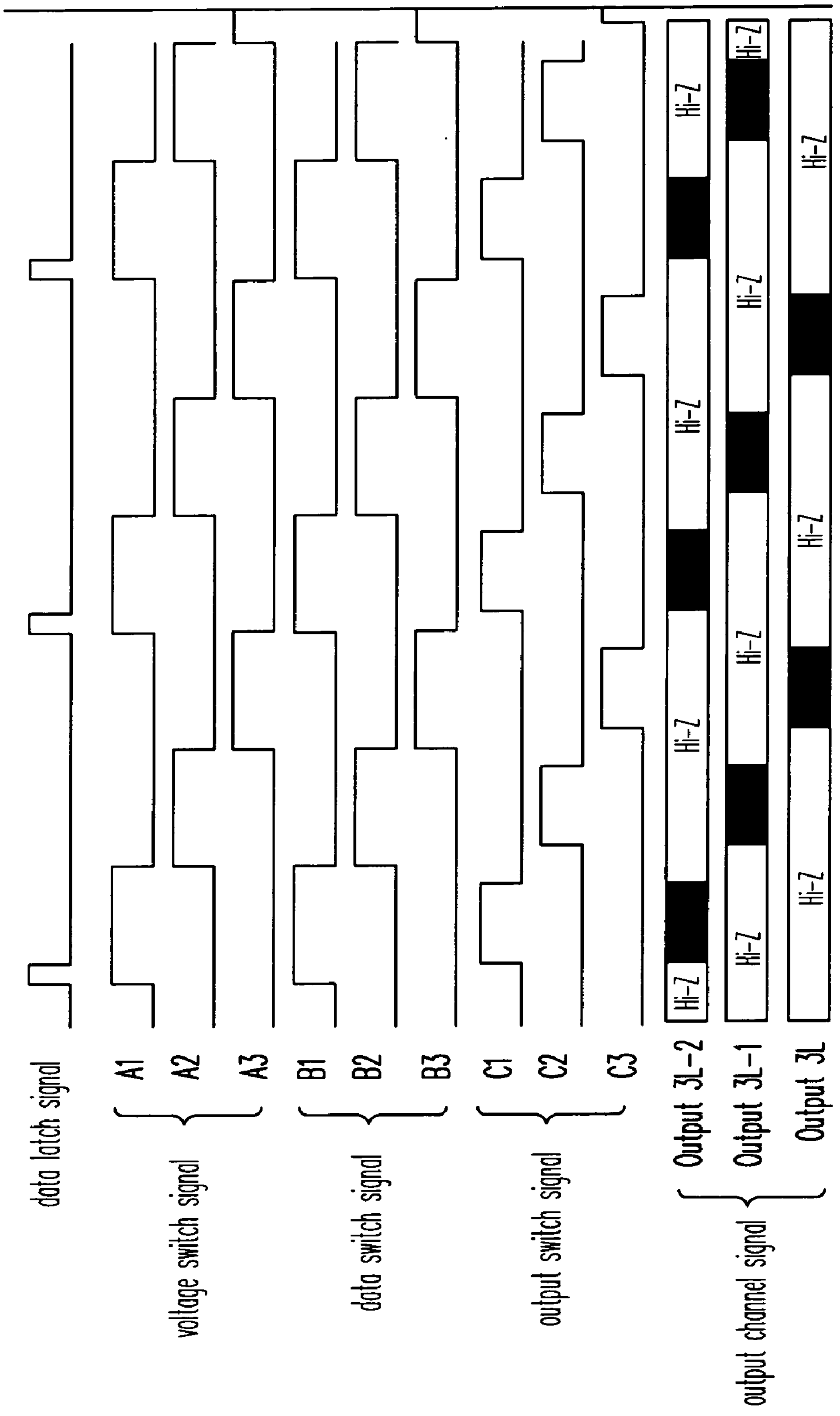
FIG. 5 illustrates the timing signal wave-forms of a data latch signal, a voltage switch signal, a data switch signal, and an output switch signal, according to an embodiment of the present invention.

According to an embodiment of the present invention, the timing control method of the timing control device 416 in the source driver 400 is described below. Referring to FIG. 5, the wave-forms of timing data signals such as data latch signal, voltage switch signal, data switch signal, and output switch signal are illustrated. In FIG. 5, Latch Data is the driving signal wave-form of the data-receiving device; A1~A3 are 3-Gamma (R, G, and B) timing signal wave-forms of voltage switches respectively; B1~B3 are 3-Gamma (R, G, and B) timing signal wave-forms of data switches respectively; C1~C3 are 3-Gamma (R, G, and B) timing signal wave-forms of output switches respectively; and Output 3L−2~3L are timing data signal wave-forms of output channels respectively.

Firstly, timing control device 416 sends a latch data signal (LDS), and the N number of voltage switches of Gamma voltage switch set 414 conduct a first voltage generating circuit of Gamma voltage generator 412 and DAC set 406 for the first time, wherein each voltage switch is connected to the L number of DACs simultaneously. In FIG. 5, A1 signal is conducted and inputted for the first time, for example the signal value of voltage generating circuit for red color. Meanwhile, the data switch set 404 is also turned on for the first time, to transmit the red data signal B1 of the 3 data signals (R, G, and B) in the data-receiving device 402 into DAC set 406. This data signal is used for determining the digital input value of the DACs. Meanwhile, L number of output switches of output unit set 408 conducts the L number of DACs and the corresponding 3L number of output channels for the first time, to finish the driving of outputting the first data signal in the source driver. FIG. 5 illustrates the timing wave-form of output switch signal C1 for red color and the data signal timing wave-form of output channel Output 3L−2.

Subsequently, timing control device 416 executes the driving of second (e.g. green color) and third (e.g. blue) color data signal. The N number of voltage switches of Gamma voltage switch set 414 conduct a second voltage generating circuit of Gamma voltage generator 412 and DAC set for the second time, wherein each voltage switch is connected to the L number of DACs simultaneously. In FIG. 5, A2 signal is conducted and inputted for the second time, for example the signal value of voltage generating circuit for green color. Meanwhile, data switch set 404 is conducted for the second time, to transmit the green data signal B2 of the 3 data signals (R, G, and B) in the data-receiving device 402 into DAC set 406. This data signal is used for determining the digital input value of the DACs. Meanwhile, the L number of output switches of the output unit set 408 conduct the L number of DACs and the corresponding 3L number of output channels for the second time, to finish the driving of output of the second data signal for the source driver. FIG. 5 illustrates the timing wave-form of output switch signal C2 for green color and the data signal timing wave-form of output channel Output 3L−1.

Finally, the conducting for the third time (e.g. for blue color) is performed. The driving method is identical to the methods described above. N number of voltage switches conduct a third voltage generating circuit and DAC set 406 for the third time. And meanwhile L number of data switches are conducted to transmit a blue data signal to L number of DACs. The corresponding L number of output switches are turned on, to transmit the data signal to the corresponding 3L output channels through L number of DACs to finish the driving of output of the third data signal. FIG. 5 illustrates the timing wave-form of output switch signal C3 for blue color and timing wave-form of the data signal of output channel Output 3L.

Accordingly, data signal can be outputted in the manner of timing by using the timing control device 416 and the voltage switch set 414, the data switch set 404, and the output switch set 408 controlled by the timing control device 416.

Figure 6:
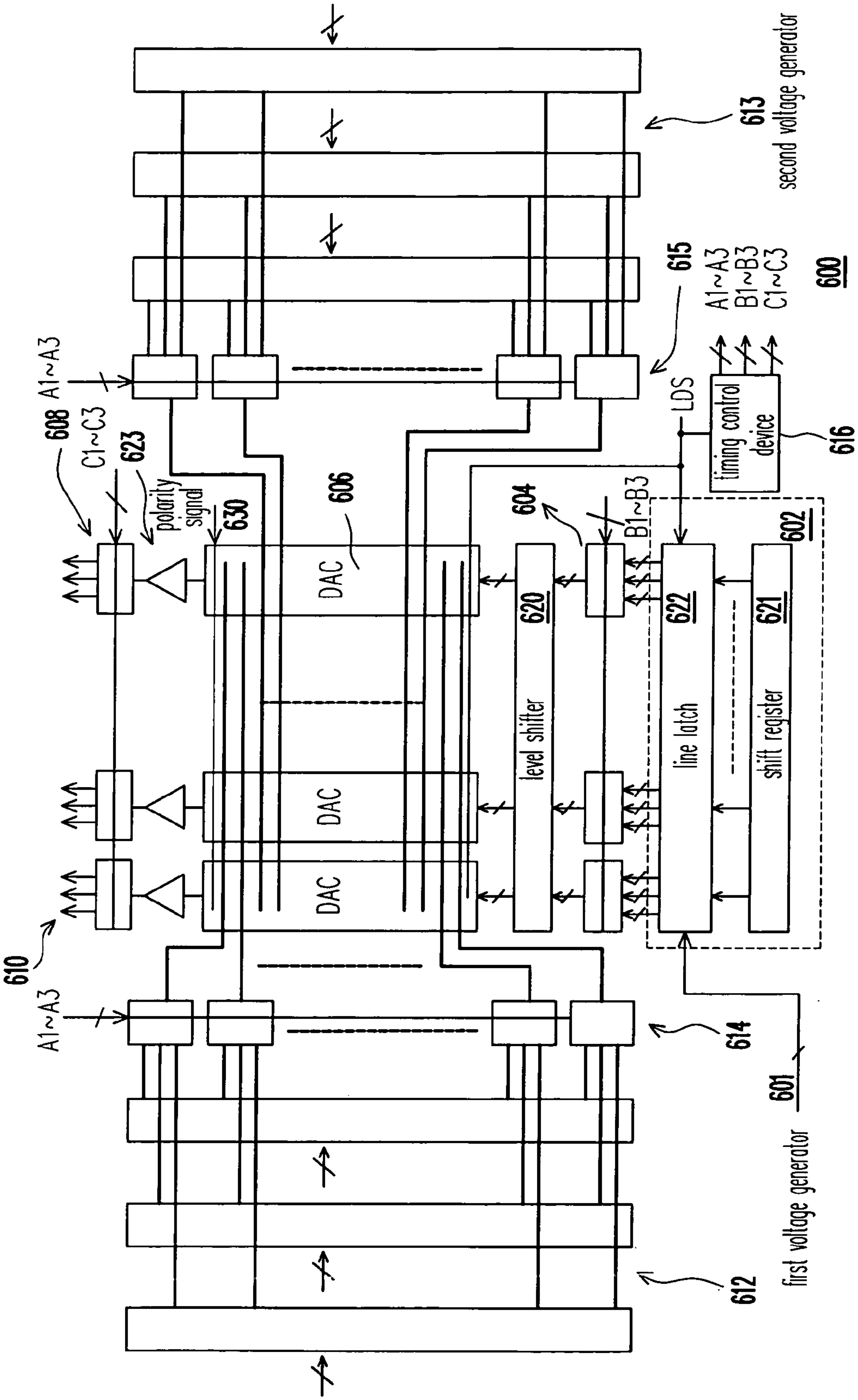
FIG. 6 is a circuit block diagram illustrating a source driver according to another embodiment of the present invention.

FIG. 6 is a circuit block diagram illustrating a source driver adapted to a display panel according to another embodiment of the present invention. Referring to FIG. 6, a source driver 600 includes: a data-receiving device 602, which receives data signal input 601 and then registers and outputs the received data signal input 601; a data switch set 604 including L number of data switches and is connected to the data-receiving device 602 for selectively outputting the data signal from the data-receiving device 602; a first voltage generator 612 which generates n number of voltages, according to m number of reference voltages inputted externally, to be used by the source driver 600; a second voltage generator 613 which generates n number of voltages, according to m number of reference voltages inputted externally, to be used by the source driver 600; a digital to analog converter (DAC) set 606 including L number of DACs, wherein each DAC receives the data signal from the data-receiving device 602 and converts this digital data signal into an analog data signal; a first voltage switch set 614 including N number of voltage switches, wherein each of the voltage switches is used for selectively outputting one of the voltages from the voltage generator 612, and each of the voltage switches is connected to the L number of DACs simultaneously; a second voltage switch set 615 including N number of voltage switches, wherein each of the voltage switches is used for selectively outputting one of the voltages from the voltage generator 613, and each of the voltage switches is connected to the L number of DACs simultaneously; an output unit set 608 including L number of output units, each of the output units being connected to a corresponding DAC to receive and selectively output the analog signal from the DAC; 3L number of output channels 610, every 3 output channels being connected to a corresponding output unit to receive data signals from the output unit and output it to the outside of source driver 600; and a timing control device 616 for generating timing control signals for driving the data-receiving device 602, the DAC set 606, the data switch set 604, the voltage switch sets 614, 615, and the output unit set 608.

According to an embodiment of the present invention, the data-receiving device 602 includes a shift register 621 and a line latch 622, wherein the shift register 621 is used to input in parallel or in serial and register a data signal according to the shift signal which shifts leftwards or rightwards. The data signal is then read in parallel or in serial and latched by the line latch 622, which is connected to the shift register 621.

According to an embodiment of the present invention, a selectively used buffer set 623 connected between the DAC set 606 and the output unit set 608 is used for reducing the decline of signal.

According to an embodiment of the present invention, an optionally used level shifter 620 connected between the data switch set 604 and the DAC set 606 is used for raising the data signal to a voltage level required.

According to an embodiment of the present invention, the output unit set 608 is composed of L number of data output switches, wherein each data output switch is connected to a corresponding DAC for receiving and selectively outputting the analog signal from the DAC.

Compared with the source driver 400 described above, it can be seen that the difference of source driver 600 is that it includes a first voltage generator 612 and a second voltage generator 613, and a corresponding first voltage switch set 614 and a corresponding second voltage switch set 615 respectively. Source driver 600 is adapted to bipolar driving (e.g. alternatively switching between positive polarity and negative polarity) for a display panel. As shown in FIG. 6, circuits of the first voltage generator 612 and the second voltage generator 613 are symmetrical, and are connected respectively to the first voltage switch set 614 and the second voltage switch set 615. In addition, the first voltage switch set 614 and the second voltage switch set 615 are both connected to the DAC set 606 (the center part as shown).

Figure 7:
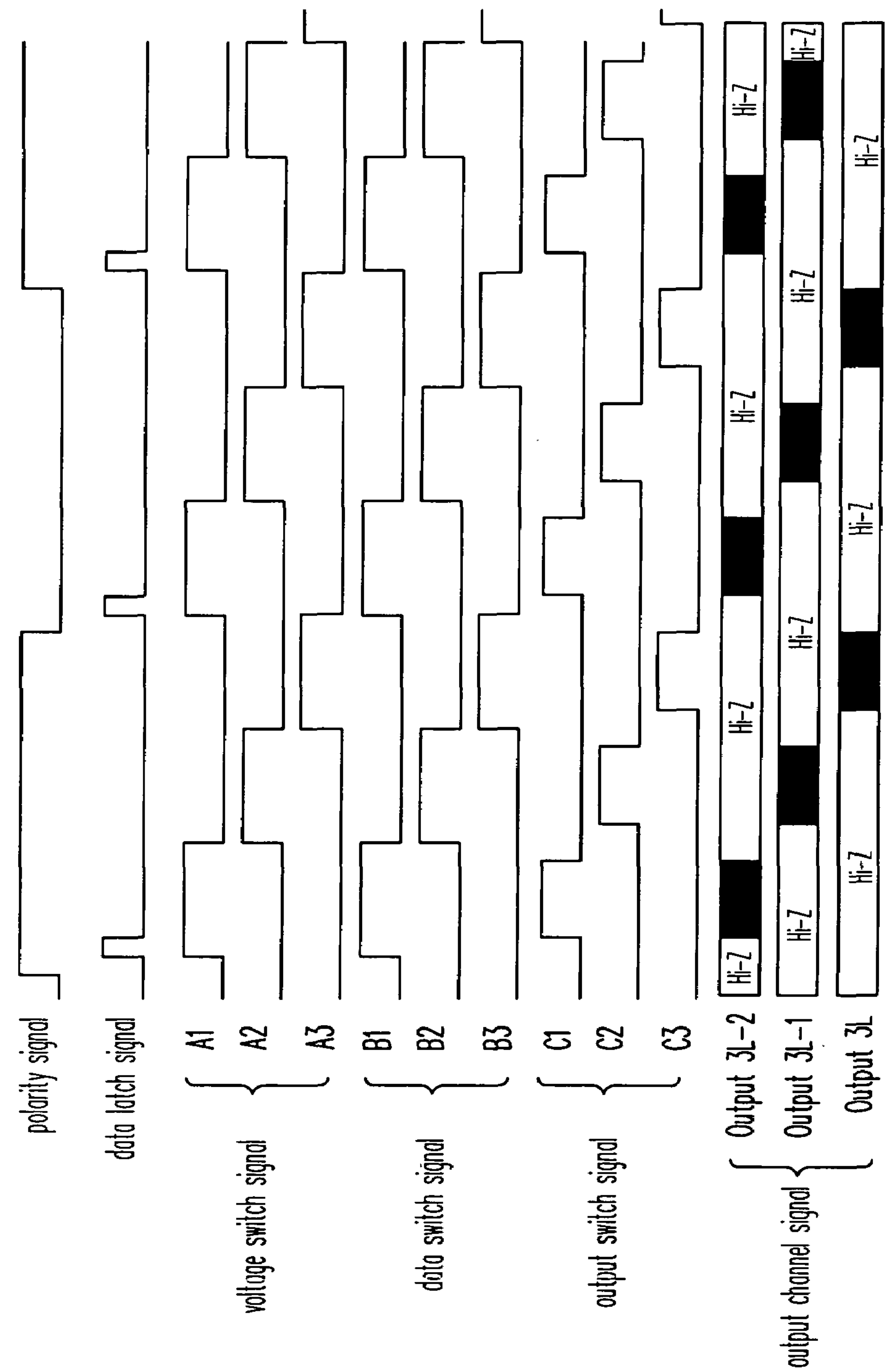
FIG. 7 illustrates the timing signal wave-forms of a polarity signal, a data latch signal, a voltage switch signal, a data switch signal, and an output switch signal, according to another embodiment of the present invention.

Note that, to alternatively switching of the bipolarity for the source driver 600 (positive polarity and negative polarity) alternatively, a polarity signal 630 for switching polarity is needed. FIG. 7 illustrates the timing wave-forms of a latch data signal, a voltage switch signal, a data switch signal, and an output switch signal used for the source driver 600. Referring to FIG. 7, the data latch signal is the driving signal wave-form of the data-receiving device; A1~A3 are timing signal wave-forms of voltage switches for 3-Gamma (R, G, and B) respectively; B1~B3 are timing signal wave-forms of data switches for 3-Gamma (R, G, and B)respectively; C1~C3 are timing signal wave-forms of output switches for 3-Gamma (R, G, and B) respectively; and data output signals 3L−2~3L are timing data signal wave-forms of output channels respectively. It can be seen clearly that compared with the timing control wave-forms of source driver 400 in FIG. 5, in FIG. 7 a polarity signal for switching polarities is added.

In the present embodiment, the timing control method of source driver 600 is identical to the timing control method of source driver 400 described above and is not described again.

Figure 8:
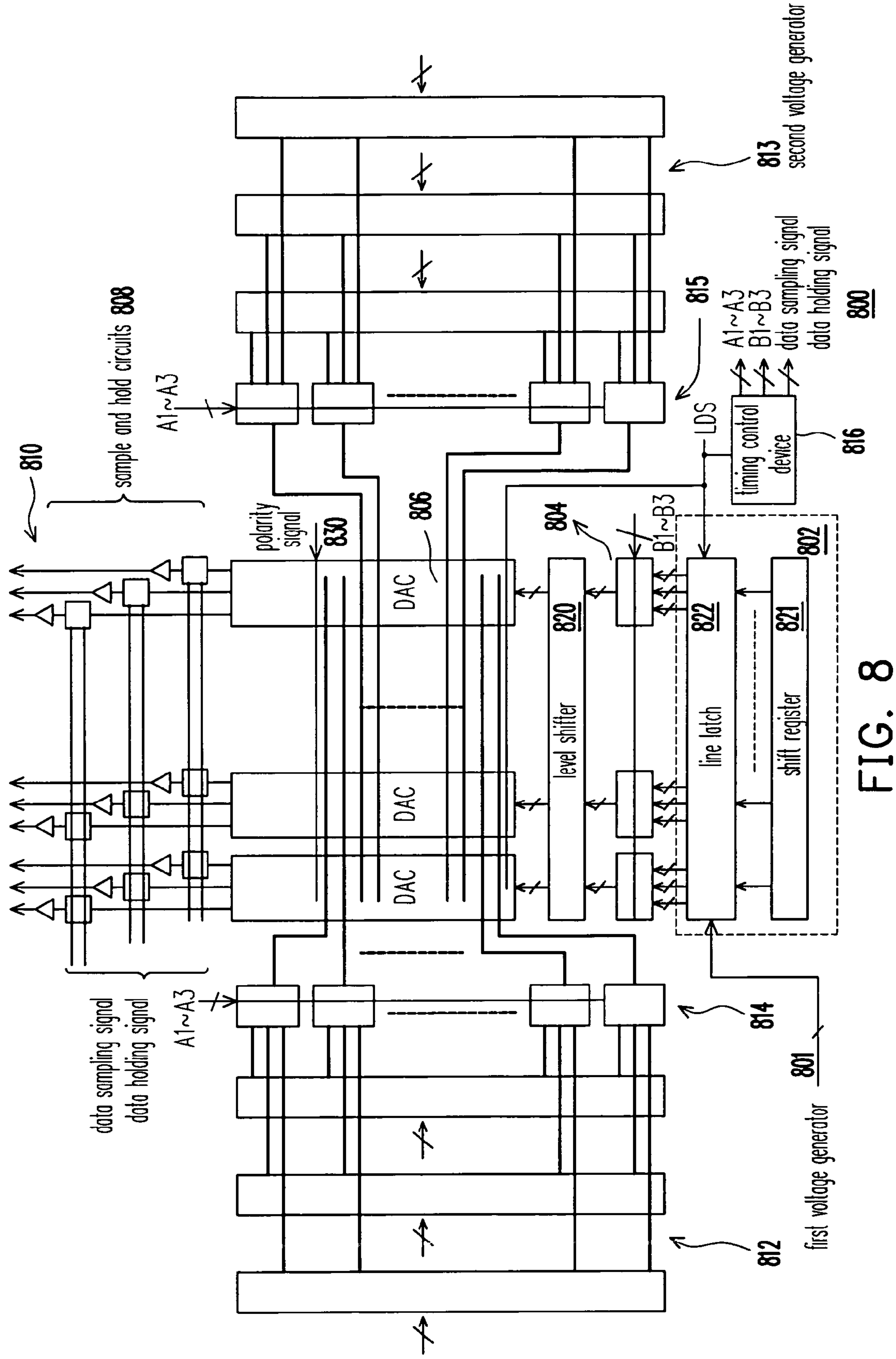
FIG. 8 is a circuit block diagram illustrating a source driver according to another embodiment of the present invention.

FIG. 8 is a circuit block diagram illustrating a source driver adapted to a display panel according to yet another embodiment of the present invention. Referring to FIG. 8, the source driver 800 includes: a data-receiving device 802, which receives data signal input 801 and then registers and outputs the received data signal input 801; a data switch set 804 including L number of data switches, for selectively outputting the data signal from the data-receiving device 802; an optionally used level shifter 820 connected to the data switch set 804, for receiving the data signal and converting it to a voltage level required; a first voltage generator 812 which generates n number of voltages, according to m number of reference voltages inputted externally, to be used by the source driver 800; a second voltage generator 813 which generates n number of voltages, according to m number of reference voltages inputted externally, to be used by the source driver 800; a digital to analog converter (DAC) set 806 including L number of DACs, wherein each DAC receives the data signal from the data-receiving device 802 and converts this digital data signal into an analog data signal; a first voltage switch set 814 including N number of voltage switches, wherein each of the voltage switches is used for selectively outputting a voltage, and each of the voltage switches is connected to the L number of DACs simultaneously; a second voltage switch set 815 including N number of voltage switches, wherein each of the voltage switches is used for selectively outputting a voltage, and each of the voltage switches is connected to the L number of DACs simultaneously; a sample and hold circuit set 808 including 3L number of sample and hold circuits, every 3 sample and hold circuits being connected to a corresponding DAC, and the 3L number of sample and hold circuits are used for sampling and holding data signal input from DAC set 806; 3L number of output channels 810, each output channel being connected to a corresponding sample and hold circuit, for outputting data signal of the source driver 800 to the outside; and a timing control device 816 for providing control signals for driving the data-receiving device 802, the DAC set 806, the data switch set 804, the voltage switch sets 814, 815, and the sample and hold circuit set 808.

Figure 9:
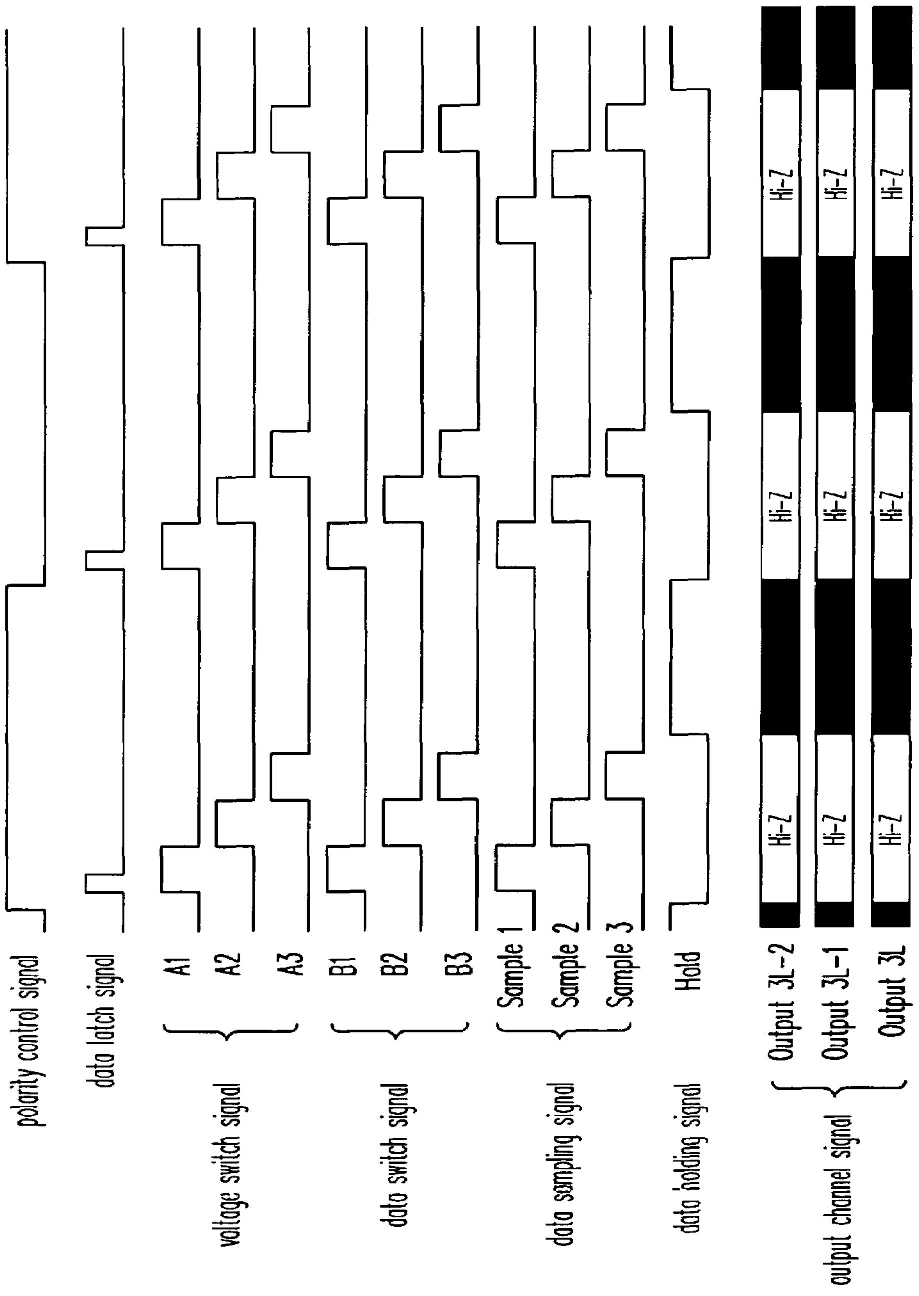
FIG. 9 illustrates the timing signal wave-forms of a polarity control signal, a data latch signal, a voltage switch signal, a data switch signal, and a sampling and a holding signal, according to yet another embodiment of the present invention.

According to an embodiment of the present invention, the timing control method of the timing control device in source driver 800 is described below. FIG. 9 illustrates the timing wave-forms of a polarity control signal, a data latch signal, a voltage switch set signal, a data switch set signal, and a sample and hold circuit set signal. Referring to FIG. 9, the polarity control signal and data latch signal are the driving signal wave-forms used in data-receiving device 800; A1~A3 are timing signal wave-forms of voltage switches for 3-Gamma (R, G, and B) respectively; B1~B3 are timing signal wave-forms of data switches for 3-Gamma (R, G, and B) respectively; the sampling data signals 1~3 are timing wave-forms of sampling data respectively; the data holding signal is timing wave-form of holding data; and the data output signals 3L−2~3L are timing data signal wave-forms of output channels respectively.

Firstly, the timing control device 816 sends a data latch signal, and N number of voltage switches of a first voltage switch set 814 turn on for the first time and determines to conduct either the first voltage generator 812 or the second voltage generator 813 and DAC set according to the polarity control signal (logical High or Low). Each voltage switch is connected to L number of DACs simultaneously. In FIG. 8, signal A1 (e.g. the signal value of voltage generating circuit for red color) is conducted for the first time. Meanwhile, data switch set 804 is also turned on for the first time to transmit the red data signal B1 of the 3 data signals (R, G, and B) in the data-receiving device 802 to DAC set. The data signal is used for determining the digital input value of the DAC. Here, sample and hold circuits (S/H) 808 will sample a first data signal (e.g. red color) first, and at this time, data wave is at Low state and this data signal would not be sent to the corresponding output channel. Otherwise, after the conducting of the voltage switches and data switches similar to above descriptions are all turned on for the first, the second, and the third times, such that all the data signals (including red, green, and blue colors) are sampled and held, and all data signals are then transmitted to output channels synchronously. Accordingly, as shown in FIG. 9, the three primary colors of Output 3L−2~3L are outputted at the same timing for the driving operation of data.

Figure 10:
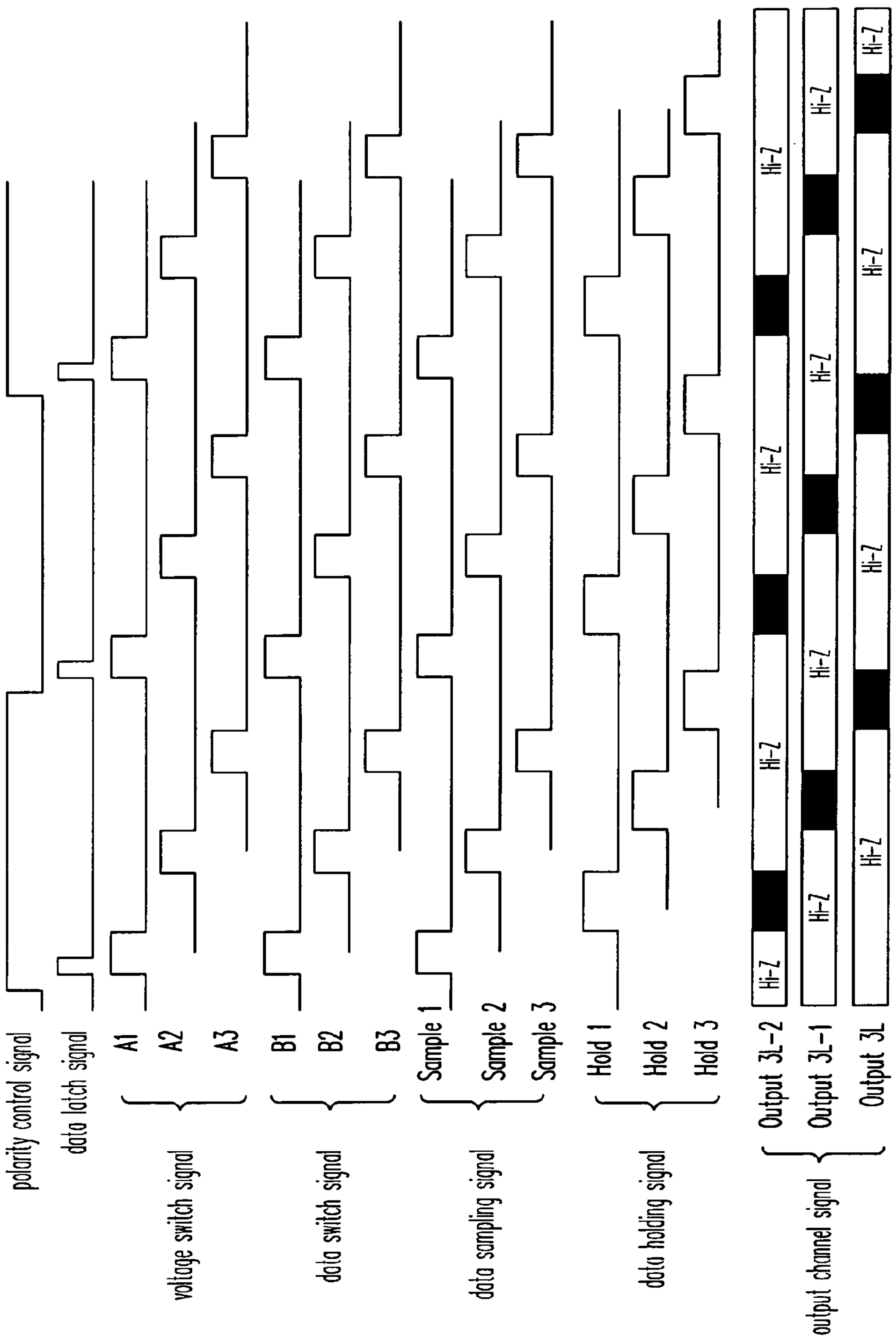
FIG. 10 illustrates the timing signal wave-forms of a polarity control signal, a data latch signal, a voltage switch signal, a data switch signal, and a sampling and a holding signal when the data signal is latched and output synchronously by sample and hold circuits.

According to an embodiment of the present invention, sample and hold circuits 808 may also output the sampled and held data signal to output channels 810 in the manner of "time sharing." Please refer to the timing wave-form in FIG. 10.

According to an embodiment of the present invention, the data signal may be any number of bits.

According to an embodiment of the present invention, the data switches, voltage switches, output switches, and sample and hold circuits may be NMOS, PMOS, transmission gates or the combination thereof.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A source driver for a display panel, at least comprising:

a data-receiving device used for receiving, registering a data signal and outputting the data signal;

a data switch set connected to the data-receiving device, for selectively conducting the data signal from the data-receiving device in response to a first timing signal;

a voltage generator, having multiple voltage generating circuits, used for generating a plurality of voltages according to a plurality of reference voltages;

a voltage switch set connected to the voltage generator, for selectively conducting the voltages from the voltage generating circuits in response to a second timing signal;

a digital to analog (DAC) set connected to the data switch set and the voltage switch set, for receiving and outputting the selectively conducted voltages according to the selectively conducted data signal;

an output unit set connected to the DAC set, for receiving the selectively conducted voltages from the DAC and providing an output voltage in response to a third timing signal; and a timing control device used for providing the first, the second, and the third timing signals.

2. The source driver as claimed in claim 1, further comprising a level shifter disposed between the data switch set and the DAC set.

3. The source driver as claimed in claim 1, further comprising a buffer disposed between the DAC set and the output unit set.

4. The source driver as claimed in claim 1, wherein the data-receiving device comprises a shift register and a line latch.

5. The source driver as claimed in claim 1, wherein the output unit set comprises a plurality of output switches.

6. The source driver as claimed in claim 1, wherein the output unit set comprises a plurality of sample and hold circuits.

7. The source driver as claimed in claim 1, comprising a first voltage generator and a second voltage generator, and a corresponding first voltage switch set and a second voltage switch set, wherein the polarity of voltages generated by the first voltage generator are opposite to the polarity of voltages generated by the second voltage generator.

8. The source driver as claimed in claim 1, wherein the voltage generator includes three voltage generating circuits for providing the Gamma voltages of three primary colors respectively.

9. The source driver as claimed in claim 1, wherein the data signal is any number of bits.

10. The source driver as claimed in claim 1, wherein the data switch is a NMOS, a PMOS, or a transmission gate.

11. The source driver as claimed in claim 1, wherein the voltage switch may be a NMOS, a PMOS, or a transmission gate.

12. The source driver as claimed in claim 1, wherein the sample and hold circuit is a NMOS, a PMOS, or a transmission gate.

13. A timing control method, comprising:

(a) receiving a data signal by a data-receiving device, wherein the data signal comprises a plurality of color data signals, and selectively outputting one of the color data signals in response to a first timing signal;

(b) generating a plurality of voltages by multiple voltage generating circuits of a voltage generator according to a plurality of reference voltages, and selectively outputting the voltages in response to a second timing signal;

(c) outputting the selectively outputted voltages by a DAC set according to the data signal which is selectively outputted, and selectively outputting an output voltage in response to a third timing signal; and repeating above-mentioned step (a), step (b), and step (c) until all the color data signals of the data signal have been outputted.

14. The timing control method as claimed in claim 13, wherein the color data signals comprise data signals of three primary colors.

15. The timing control method as claimed in claim 13, wherein the color data signals comprise data signals of white and three primary colors.

16. The timing control method as claimed in claim 13, wherein in step (b), the voltages being output in each enabling period are selected from one of the voltage generating circuits.

17. The source driver as claimed in claim 1, wherein each one switch of the voltage switch set is connected to the voltage generating circuits to select the output voltages from one of the voltage generating circuits.

* * * * *